United States Patent
Verma et al.

(10) Patent No.: US 6,486,017 B1
(45) Date of Patent: Nov. 26, 2002

(54) METHOD OF REDUCING SUBSTRATE COUPLING FOR CHIP INDUCTORS BY CREATION OF DIELECTRIC ISLANDS BY SELECTIVE EPI DEPOSITION

(75) Inventors: Purakh Raj Verma, Singapore (SG); Sanford Chu, Singapore (SG); Johnny Chew, Singapore (SG); Sia Choon Beng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/161,772

(22) Filed: Jun. 4, 2002

(51) Int. Cl.$^7$ ............................................. H01L 21/8234
(52) U.S. Cl. .......................... 438/238; 438/381; 438/269
(58) Field of Search ................................. 438/238, 381, 438/41–44, 269

(56) References Cited

U.S. PATENT DOCUMENTS

| | | | |
|---|---|---|---|
| 5,578,860 A | * 11/1996 | Costa et al. | 257/362 |
| 6,057,202 A | 5/2000 | Chen et al. | 438/381 |
| 6,093,599 A | 7/2000 | Lee et al. | 438/238 |
| 6,153,489 A | 11/2000 | Park et al. | 438/381 |
| 6,225,182 B1 | * 5/2001 | Chu et al. | 438/369 |

* cited by examiner

*Primary Examiner*—Jey Tsai
(74) *Attorney, Agent, or Firm*—George O. Saile; Rosemary L. S. Pike

(57) ABSTRACT

A new method is provided for the creation of a horizontal spiral inductor over the surface of a silicon substrate. A first layer of dielectric is deposited over the surface of the substrate, this first layer of dielectric is patterned and etched creation islands of first dielectric material overlying the surface of the substrate, the islands of first dielectric material align with coils of a thereover to be created spiral inductor. The openings created in the layer of dielectric by the patterning and etching of the first layer of dielectric are filled by selective deposition of epitaxial silicon therein. Second and third layers of dielectric are successively deposited over the surface of the first layer of dielectric. A spiral horizontal inductor is then created over the surface of the third layer of dielectric.

30 Claims, 2 Drawing Sheets

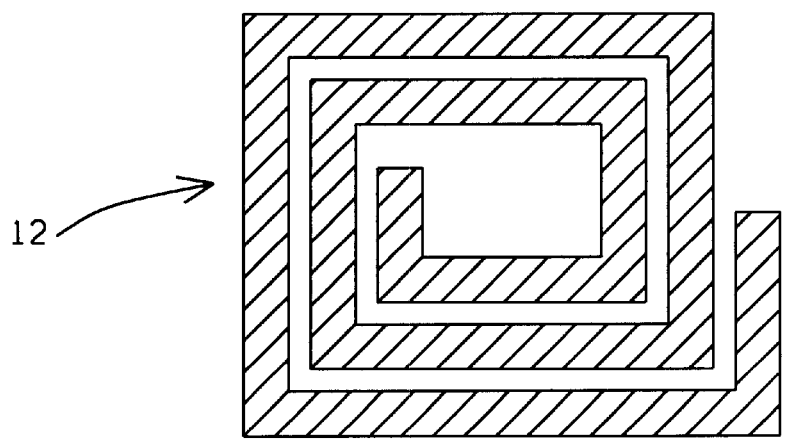
*FIG. 1a — Prior Art*
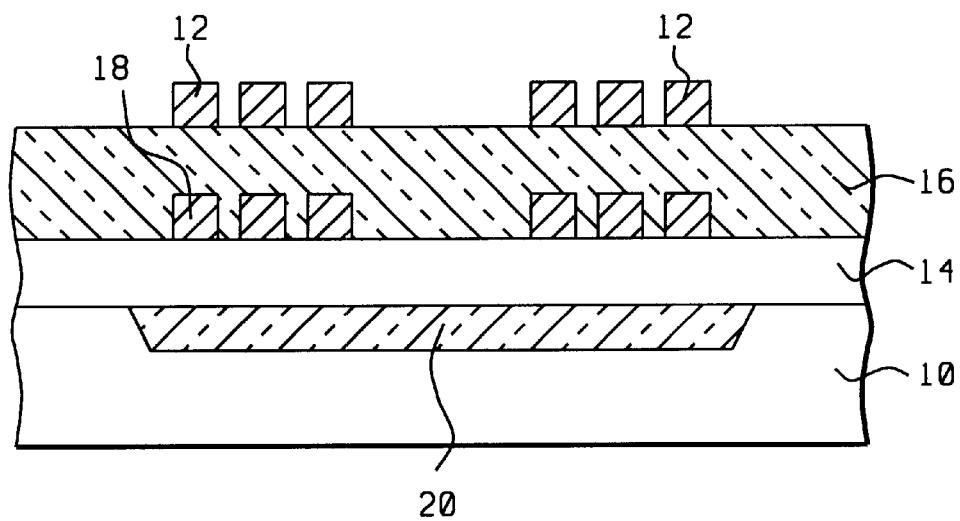
*FIG. 1b — Prior Art*
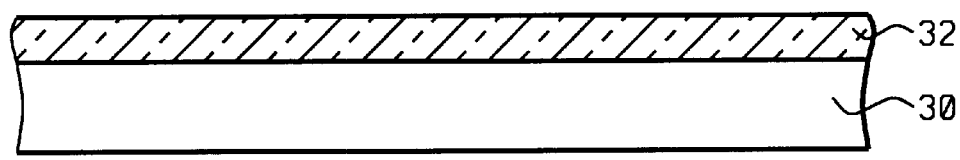
*FIG. 2*

METHOD OF REDUCING SUBSTRATE COUPLING FOR CHIP INDUCTORS BY CREATION OF DIELECTRIC ISLANDS BY SELECTIVE EPI DEPOSITION

BACKGROUND OF THE INVENTION (1) Field of the Invention

The invention relates to the fabrication of integrated circuit devices, and more particularly, to a method that reduces electromagnetic coupling between an inductor created over the surface of a silicon substrate and the underlying silicon substrate.

(2) Description of the Prior Art

Semiconductor devices have of late seen increased use in such applications as cellular telephones, wireless modems and a general range of communication equipment, which has created the need for Integrated Circuits having capabilities of radio frequency (RF) amplification up to extended frequencies in the range of several gigahertz. This has led to the need to create Integrated Circuits whereby active semiconductor elements are combined with passive electrical components and are created over the surface of one monolithic semiconductor substrate.

There are a number of significant advantages in integrating on one semiconductor monolithic substrate the functions of conventional semiconductor devices with functions that are typically performed by a RF amplifier. For instance, manufacturing costs can be significantly reduced while power consumption for the combined functions is also limited. Inductors however typically are of significant size and therefore require a large surface area of the semiconductor device for their implementation. The inductors are typically formed on the surface of a substrate in a spiral form, resulting in parasitic capacitance and substrate loss that have a serious negative effect on the functionality of the created LC circuit by sharply reducing the frequency of resonance of this circuit.

The incorporation of RF inductors without sacrificing device performance due to substrate losses has been extensively researched in recent years. Some of the techniques that have been used for this approach include:

the selective removing (by etching) of the silicon underneath the inductor (using methods of micro-machining)

using multiple layers of metal (such as aluminum) interconnects or of copper damascene interconnects using a high resistivity silicon substrate employing biased wells underneath a spiral conductor inserting various types of patterned ground shields between the spiral inductor and the silicon substrate increasing the thickness of the inter-layer dielectric.

The above listing of researched alternatives is not meant to be complete or all inconclusive. All of the above approaches have as common objectives to:

1) enhance the quality (Q) value of the inductor, and
2) increase the frequency of the LC self-resonance thereby increasing the frequency range over which the inductor can be used.

The invention addresses the above highlighted concerns an provides a method whereby the electromagnetic coupling between a horizontal inductor, that is created over the surface of a silicon substrate, and the underlying silicon substrate is reduced, thus increasing the operational capability and frequency range of the inductor.

U.S. Pat. No. 6,093,599 (Lee et al.) shows a process for an inductor over a polysilicon filled trench.

U.S. Pat. No. 6,225,182 B1 (Chu et al.) discloses a process for an inductor over an epitaxial layer.

U.S. Pat. No. 6,057,202 (Chen et al.) reveals a spiral inductor process over an air trench in the substrate.

U.S. Pat. No. 6,153,489 (Park et al.) shows an inductor over a porous silicon layer.

SUMMARY OF THE INVENTION

A principle objective of the invention is to improve circuit performance of semiconductor devices comprising active and passive components over the surface of one monolithic substrate.

Another objective of the invention is to provide a method for increasing the separation between an inductor that is created over the surface of one monolithic substrate and the underlying monolithic substrate.

Yet another objective of the invention is to improve RF circuit performance for RF circuits that are created using an inductor that is created over the surface of one monolithic substrate.

In accordance with the objectives of the invention a new method is provided for the creation of a horizontal spiral inductor over the surface of a silicon substrate. A first layer of dielectric is deposited over the surface of the substrate, this first layer of dielectric is patterned and etched creation islands of first dielectric material overlying the surface of the substrate, the islands of first dielectric material align with coils of a thereover to be created spiral inductor. The openings created in the layer of dielectric by the patterning and etching of the first layer of dielectric are filled by selective deposition of epitaxial silicon therein. Second and third layers of dielectric are successively deposited over the surface of the first layer of dielectric. A spiral horizontal inductor is then created over the surface of the third layer of dielectric.

BRIEF DESCRIPTION OF THE DRAWINGS

FIG. 1a shows atop view of a conventional horizontal spiral inductor.

FIG. 1b shows a cross section of a conventional horizontal spiral inductor.

FIGS. 2 through 5 shown the invention, as follows:

FIG. 2 shows the cross section of a substrate over the surface of which a layer of dielectric has been deposited.

FIG. 3 shows a cross section after the deposited layer of dielectric ahs been patterned and etched, creating islands of dielectric over the surface of the substrate.

FIG. 4 shows a cross section of the substrate after the openings that have been created through the layer of dielectric are filled with epitaxial silicon.

FIG. 5 shows a cross section of the substrate after the horizontal inductor has been created over the surface of the substrate over the surface of deposited layers of dielectric and aligned with the island of dielectric that have been created on the surface of the substrate.

DESCRIPTION OF THE PREFERRED EMBODIMENTS

Figure 3:
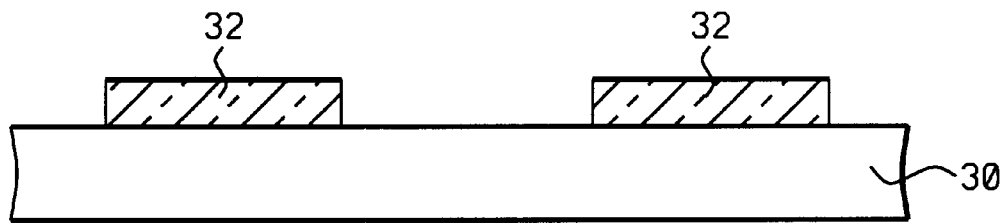

The invention addresses concerns relating to the creation of an inductor over the surface of one monolithic substrate. By increasing the distance between the inductor and the surface of the substrate over which the inductor is being created, electromagnetic losses that are conventionally incurred by the inductor are reduced, increasing the quality factor of the inductor and therewith improving the RF performance and frequency range of the circuit of which the inductor is a component.

It is, as previously stated and specifically in view of the cost advantages that are offered thereby, desirable to be able to create an inductor over the same monolithic substrate over which active semiconductor devices are created. The parasitic capacitances that occur as part of this creation however limit the quality factor of the inductor that can be achieved using the conventional silicon process to about 10. This limitation is, for many applications, not acceptable. Dependent on the frequency at which the LC is designed to resonate, significantly larger values of the quality factor, for instance 15 or more for on-chip inductors, must be available. Prior Art has in this been limited to creating values of higher quality factor as separate units and integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the subcomponents of the assembly thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The quality factor Q of an inductor can be described as follows: $Q=Es/El$ wherein Es is the energy that is stored in the reactive portion of the component while El is the energy that is lost in the reactive portion of the component. The better the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component which can be degraded due to parasitics. In an actual configuration, there are always some physical resistors that will dissipate power thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

As has previously been stated, the self-resonance that is caused by the parasitic capacitance between the (spiral) inductor and the underlying substrate will limit the use of the inductor at high frequencies. Furthermore, the lower series spreading resistance associated with the substrate, which is due to well and field implantations, will degrade the Q factor of the inductor. This has a direct effect on the usefulness of a monolithic or integrated inductor that is implemented on silicon substrates. This effect can be overcome if the area underneath the inductor can be made to appear locally insulating, which can be achieved by for instance selectively removing the underlying silicon resulting in inductors that are suspended in air. Another approach, an approach that is favored by the invention, is to increase the distance between the horizontal spiral inductance and the silicon surface over which the inductor is created such as the surface of a silicon substrate.

For a better understanding of the invention, conventional methods of creating a horizontal spiral inductor are first highlighted.

Referring for this purpose to FIGS. 1a and 1b, there is shown in FIG. 1a a top view of a spiral inductor 12 comprising two and a half loops by way of example. This spiral inductor 12 is further highlighted in the cross section of FIG. 1b where is shown a cross section of a silicon substrate 10 in the surface of which a STI trench 20 has been created for improved separation between the inductor 12 and substrate 10. A metallic shield 18 is created spaced between the inductor 12 and the substrate 10 in order to further reduce the electromagnetic coupling between the inductor 12 and the substrate 10. For support of the metallic shield 18, a layer 14 of ILD has been deposited over the surface of substrate 10. For further support and separation of the inductor 12 a layer 16 of IMD has been deposited over the surface of the layer 14 of ILD. The STI region 20 extends over the surface of the substrate 10 such that the inductor 12 overlies the STI region 20 without extending beyond the STI region 20. The trench of the STI region 20 is conventionally between about 0.3 and 0.4 $\mu$m deep.

The problems that are encountered with the conventional method of creating a horizontal spiral inductor over the surface of a silicon substrate, as shown in cross section in FIGS. 1a and 1b, are threefold:

1. the depth of the STI trench is limited and does not adequately contribute to the separation between the inductor 12 and the silicon of the substrate 10
2. the metallic field plates 18 are not very effective in providing shielding of the electromagnetic field between the inductor 12 and the silicon substrate 10, and
3. conventional CMOS/BICMOS processes have field implantations underlying regions of STI, which reduce the substrate resistivity underneath the inductor and degrade inductor coupling to the substrate.

To counteract these problems, the invention provides a new method of creating a spiral inductor over the surface of a silicon substrate, which will now be explained in detail using FIGS. 2 through 5.

Shown in FIG. 2 is a cross section of a silicon substrate 30 over the surface of which a layer 32 of silicon oxide has been deposited. Layer 32 of silicon nitride can alternatively be a combination of silicon dioxide and silicon nitride. For substrate 30, a high-resistivity silicon is preferred by the invention since this increases resistance to the penetration of the electromagnetic field into the substrate 30 and therefore reduces the electromagnetic losses that are conventionally experienced by such a penetration.

As an example of the creation of Layer 32 of silicon oxide ($SiO_2$) can be cited using monosilane ($SiH_4$) and nitrous oxide ($N_2O$) as a source material deposited using LPCVD or PECVD procedures, at a temperature between about 300 and 800 degrees C. The thickness of layer 32 of silicon oxide can be optimized for particular applications, the preferred thickness of the invention for the layer 32 of silicon oxide is between about 3 and 4 $\mu$m.

The layer 32 of silicon oxide is next patterned and etched, using conventional methods of photolithography development and exposure. The patterning and etching of layer 32, the results of which are shown in cross section in FIG. 3, is performed such that the layer 32 is removed where this layer is not critical for the creation of an overlying inductor. That is, where support for the inductor is required thereby including processing tolerances and the like, the layer 32 of silicon oxide is not removed, the layer 32 of silicon oxide is removed in all areas where this layer is not required for the creation of an inductor above the surface thereof.

The silicon oxide layer 32 can be etched by applying an anisotropic Reactive Ion Etch (RIE) of the silicon oxide layer 32, using $CHF_3$ or $CF_4$-$O_2$-He as an etchant.

Figure 4:
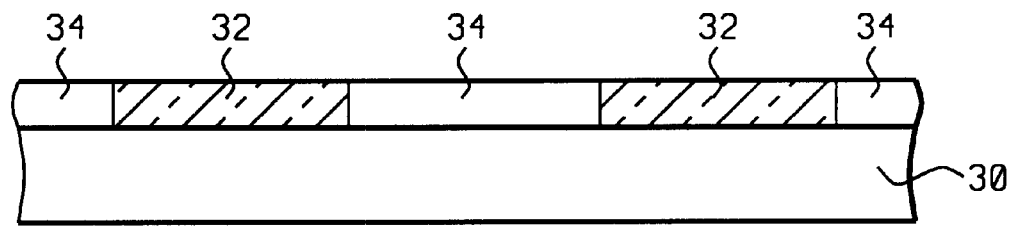

The invention then proceeds, FIG. 4, by selectively growing a layer 34 of epitaxial silicon in the openings that have been created through the layer 32 of silicon oxide. Epitaxial silicon is silicon that, as is well known in the art, has its crystal orientation controlled by the crystal substrate whereby the crystal orientation of the deposited epitaxial film is determined by the crystal orientation of the underlying silicon substrate. Layer 34 of epitaxial silicon must be free of crystallographic defects causing no stress in the layer 34.

Where the preferred thickness of layer 32 of silicon oxide has been indicated as being between about 3 and 4 $\mu$m, the preferred thickness of layer 33 of epitaxial silicon is a thickness of at least 3 $\mu$m.

Figure 5:
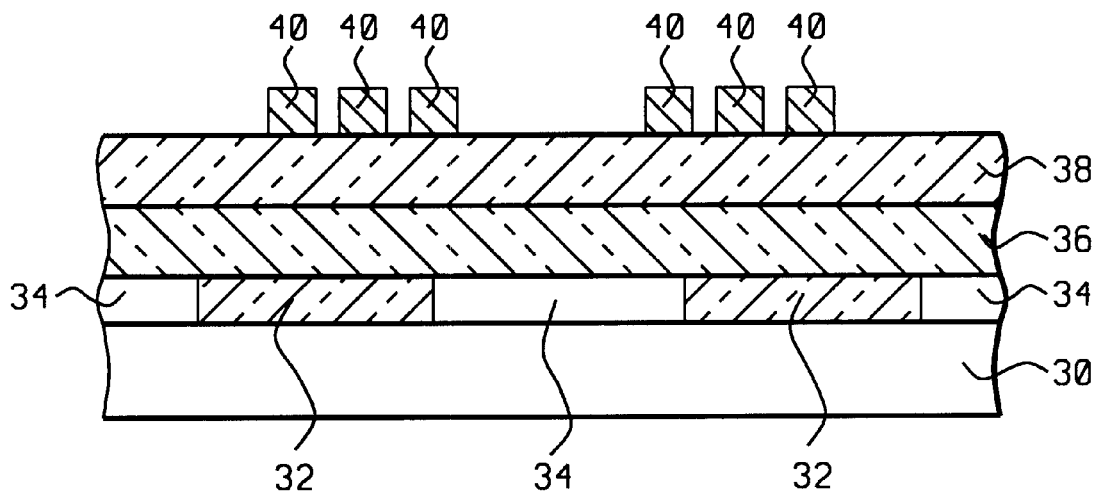

The cross section that is shown in FIG. 5 shows how the invention further completes the creation of a horizontal spiral inductor. Added to the structure that is shown in cross section in FIG. 4 are the layers 36 of Intra Level Dielectric (ILD) and 38 of Inter Metal Dielectric (IMD).

A typical application of a layer of Intra level dielectric is depositing a layer of $SiO_2$ using CVD technology at a temperature of between about 400 and 800 degrees C. The layer 36 of ILD is deposited to a thickness that is design dependent and can range between a value of about 4,000 Angstrom and 10,000 Angstrom. The layer 36 is, after it has been deposited, polished using CMP technology in order to assure good planarity of the surface of layer 36.

An inter metal dielectric (IMD) layer is preferably formed of plasma oxide, spin-on-glass or LPCVD oxide material and specifically has a thickness of between 5,000 and 15,000 Angstrom.

After layers 36 and 38 have been deposited as shown in cross section in FIG. 5, the inductor 40 is then created over the surface of the upper layer 38 if IMD, using conventional methods of metal deposition, patterning and etching. As a further special aspect of the invention it must be noted in the cross section of FIG. 5 that the coils of inductor 40 align with and are located above the patterned and etched layers 32 of silicon oxide. The thickness of the layer 32 over which the inductor 40 is created provide additional spacing between the inductor 40 and the substrate 30 and provides therefore a design parameters that can be optimized for optimum performance of the inductor at selected frequencies of operation thereof.

The invention can be summarized as follows:

the addition of oxide layer (32) underneath the inductor selectively maintains a high resistivity substrate underneath the inductor, which enhances electromagnetic de-coupling between the inductor and the substrate; substrate resistivity underneath regions of STI and other regions are relatively low the need for metallic field plates that are conventionally used for increased shielding between a horizontal spiral inductor and the silicon substrate over which the inductor is created is eliminated the need for the creation of an STI region in the surface of the substrate over which a horizontal spiral inductor is removed extra spacing is provided between a horizontal spiral inductor and the surface of the silicon substrate over which the horizontal spiral inductor is created the thickness of the extra spacing that is provided between a horizontal spiral inductor and the surface of the silicon substrate over which the horizontal spiral inductor is created can be adjusted, providing a design parameters that allows for the adjustment of optimum performance of the created inductor at a selected RF frequency of frequency range, and the extra spacing that is provided between a horizontal spiral inductor and the surface of the silicon substrate over which the horizontal spiral inductor is created provides excellent electromagnetic decoupling between the horizontal spiral inductor and the underlying silicon substrate.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of reducing substrate coupling for an inductor created over the surface of a high resistivity substrate, comprising the steps of:

providing a substrate;

depositing a first layer of dielectric over the surface of said substrate;

patterning and etching said first layer of dielectric, creating openings through said first layer of dielectric, further creating a pattern of first dielectric overlying said substrate and being aligned with coils of a thereover to be created inductor;

filling said openings created through said first layer of dielectric with epitaxial silicon;

depositing a second layer of dielectric over the surface of said pattern of first dielectric, thereby including the surface of said filling of epitaxial silicon;

depositing a third layer of dielectric over the surface of said second layer of dielectric; and creating a horizontal spiral inductor over the surface of said third layer of dielectric.

2. The method of claim 1, said pattern of first dielectric overlying said substrate being in alignment with coils of said inductor created in a Cartesian X-direction, said pattern of first dielectric in addition being in alignment with coils of said inductor created in a Cartesian Y-direction, said Cartesian X-direction intersecting said Cartesian Y-direction under an angle of about 90 degrees.

3. The method of claim 1, said second layer of dielectric comprising an Intra Level Dielectric.

4. The method of claim 1, said third layer of dielectric comprising an Inter Metal Dielectric.

5. The method of claim 1, said first layer of dielectric comprising silicon dioxide.

6. The method of claim 5, said silicon dioxide being deposited to a thickness between about 3 and 4 $\mu$m.

7. The method of claim 1, said epitaxial silicon being deposited to a thickness of about 3 $\mu$m.

8. A method of reducing substrate coupling for an inductor created over the surface of a substrate, comprising the steps of:

providing a substrate;

depositing a layer of silicon dioxide over the surface of said substrate;

patterning and etching said layer of silicon dioxide, creating openings through said layer of silicon dioxide, further creating a pattern of silicon dioxide overlying said substrate and being aligned with coils of a thereover to be created inductor;

filling said openings created through said layer of silicon dioxide with epitaxial silicon;

depositing a second layer of dielectric over the surface of said pattern of silicon dioxide, thereby including the surface of said filling of epitaxial silicon;

depositing a third layer of dielectric over the surface of said second layer of dielectric; and creating a horizontal spiral inductor over the surface of said third layer of dielectric.

9. The method of claim 8, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees.

10. The method of claim 8, said second layer of dielectric comprising an Intra Level Dielectric.

11. The method of claim 8, said third layer of dielectric comprising an Inter Metal Dielectric.

12. The method of claim 8, said layer of silicon dioxide being deposited to a thickness between about 3 and 4 $\mu$m.

13. The method of claim 8, said epitaxial silicon being deposited to a thickness of about 3 $\mu$m.

14. A method of reducing substrate coupling for an inductor created over the surface of a substrate, comprising the steps of:

providing a substrate;

depositing a layer of silicon dioxide over the surface of said substrate;

patterning and etching said layer of silicon dioxide, creating openings through said layer of silicon dioxide, further creating a pattern of silicon dioxide overlying said substrate and being aligned with coils of a thereover to be created inductor;

filling said openings created through said layer of silicon dioxide with epitaxial silicon;

depositing a layer of Intra Level Dielectric over the surface of said pattern of silicon dioxide, thereby including the surface of said filling of epitaxial silicon;

depositing a third layer of dielectric over the surface of said second layer of dielectric; and creating a horizontal spiral inductor over the surface of said third layer of dielectric.

15. The method of claim 14, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees.

16. The method of claim 14, said third layer of dielectric comprising an Inter Metal Dielectric.

17. The method of claim 14, said layer of silicon dioxide being deposited to a thickness between about 3 and 4 $\mu$m.

18. The method of claim 14, said epitaxial silicon being deposited to a thickness of about 3 $\mu$m.

19. A method of reducing substrate coupling for an inductor created over the surface of a substrate, comprising the steps of:

providing a substrate;

depositing a layer of silicon dioxide over the surface of said substrate;

patterning and etching said layer of silicon dioxide, creating openings through said layer of silicon dioxide, further creating a pattern of silicon dioxide overlying said substrate and being aligned with coils of a thereover to be created inductor;

filling said openings created through said layer of silicon dioxide with epitaxial silicon;

depositing a layer of Intra Level Dielectric over the surface of said pattern of silicon dioxide, thereby including the surface of said filling of epitaxial silicon;

depositing a layer of Inter Metal Dielectric over the surface of said layer of Intra Level Dielectric; and creating a horizontal spiral inductor over the surface of said third layer of dielectric.

20. The method of claim 19, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees.

21. The method of claim 19, said layer of silicon dioxide being deposited to a thickness between about 3 and 4 $\mu$m.

22. The method of claim 19, said epitaxial silicon being deposited to a thickness of about 3 $\mu$m.

23. A method of reducing substrate coupling for an inductor created over the surface of a substrate, comprising the steps of:

providing a substrate;

depositing a layer of silicon dioxide over the surface of said substrate, said layer of silicon dioxide being deposited to a thickness between about 3 and 4 $\mu$m;

patterning and etching said layer of silicon dioxide, creating openings through said layer of silicon dioxide, further creating a pattern of silicon dioxide overlying said substrate and being aligned with coils of a thereover to be created inductor;

filling said openings created through said layer of silicon dioxide with epitaxial silicon;

depositing a layer of Intra Level Dielectric over the surface of said pattern of silicon dioxide, thereby including the surface of said filling of epitaxial silicon;

depositing a layer of Inter Metal Dielectric over the surface of said layer of Intra Level Dielectric; and creating a horizontal spiral inductor over the surface of said third layer of dielectric.

24. The method of claim 23, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees.

25. The method of claim 23, said epitaxial silicon being deposited to a thickness of about 3 µm.

26. A method of reducing substrate coupling for an inductor created over the surface of a substrate, comprising the steps of:

providing a substrate;

depositing a layer of silicon dioxide over the surface of said substrate, said layer of silicon dioxide being deposited to a thickness between about 3 and 4 µm;

patterning and etching said layer of silicon dioxide, creating openings through said layer of silicon dioxide, further creating a pattern of silicon dioxide overlying said substrate and being aligned with coils of a thereover to be created inductor;

filling said openings created through said layer of silicon dioxide with epitaxial silicon, said epitaxial silicon being deposited to a thickness of about 3 µm;

depositing a layer of Intra Level Dielectric over the surface of said pattern of silicon dioxide, thereby including the surface of said filling of epitaxial silicon;

depositing a layer of Inter Metal Dielectric over the surface of said layer of Intra Level Dielectric; and creating a horizontal spiral inductor over the surface of said third layer of dielectric.

27. The method of claim 26, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees.

28. A method of reducing substrate coupling for an inductor created over the surface of a substrate, comprising the steps of:

providing a substrate;

depositing a layer of silicon dioxide over the surface of said substrate, said layer of silicon dioxide being deposited to a thickness between about 3 and 4 µm;

patterning and etching said layer of silicon dioxide, creating openings through said layer of silicon dioxide, further creating a pattern of silicon dioxide overlying said substrate and being aligned with coils of a thereover to be created inductor, said pattern of silicon dioxide overlying said substrate being in alignment with coils of said inductor created in a Cartesian X-direction, said pattern of silicon dioxide in addition being in alignment with coils of said inductor created in a Cartesian Y-direction, said Cartesian X-direction intersecting said Cartesian Y-direction under an angle of about 90 degrees;

filling said openings created through said layer of silicon dioxide with epitaxial silicon, said epitaxial silicon being deposited to a thickness of about 3 µm;

depositing a layer of Intra Level Dielectric over the surface of said pattern of silicon dioxide, thereby including the surface of said filling of epitaxial silicon;

depositing a layer of Inter Metal Dielectric over the surface of said layer of Intra Level Dielectric; and creating a horizontal spiral inductor over the surface of said third layer of dielectric.

29. A method of reducing substrate coupling for an inductor created over the surface of a substrate, comprising the steps of:

providing a substrate;

depositing a first layer of dielectric over the surface of said substrate;

patterning and etching said first layer of dielectric, creating at least one opening through said first layer of dielectric, further creating a pattern of said first layer of dielectric overlying said substrate and being aligned with and underlying coils of a thereover to be created inductor;

filling said at least one opening created through said first layer of dielectric with epitaxial silicon;

depositing at least one second layer of dielectric over the surface of said pattern of said first layer of dielectric, thereby including the surface of said filling of epitaxial silicon; and creating an inductor over the surface of said at least one second layer of dielectric.

30. The method of claim 1, where a high resistivity of the substrate is selectively maintained underneath an inductor surface area by preventing all impurity implantations from penetrating into the surface of the substrate, whereby said first layer of dielectric serves as a hardmask, thereby reducing substrate coupling.

* * * * *